United States Patent
Fukuhara et al.

(10) Patent No.: US 12,542,533 B2
(45) Date of Patent: Feb. 3, 2026

(54) PACKAGED SURFACE ACOUSTIC WAVE DEVICE WITH CONDUCTIVE ROOF SUPPORTING STRUCTURE

(71) Applicant: Skyworks Solutions, Inc., Irvine, CA (US)

(72) Inventors: Hironori Fukuhara, Ibaraki (JP); Rei Goto, Osaka (JP); Keiichi Maki, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 799 days.

(21) Appl. No.: 17/816,989

(22) Filed: Aug. 2, 2022

(65) Prior Publication Data

US 2023/0066822 A1    Mar. 2, 2023

Related U.S. Application Data

(60) Provisional application No. 63/237,894, filed on Aug. 27, 2021, provisional application No. 63/237,942, (Continued)

(51) Int. Cl.
*H03H 9/25* (2006.01)
*H03H 3/08* (2006.01)
(Continued)

(52) U.S. Cl.
CPC ............... *H03H 9/25* (2013.01); *H03H 3/08* (2013.01); *H03H 9/02574* (2013.01);
(Continued)

(58) Field of Classification Search
CPC .... H03H 9/25; H03H 9/02574; H03H 9/1071; H03H 9/1092; H03H 9/145; H03H 9/64; H03H 3/08
See application file for complete search history.

(56) References Cited

U.S. PATENT DOCUMENTS 8,008,837 B2   8/2011   Fukano et al.
8,405,199 B2   3/2013   Lu et al.
(Continued)

FOREIGN PATENT DOCUMENTS

CN    106688180    7/2019
CN    110380703    10/2019
(Continued)

Primary Examiner — Emily P Pham
(74) Attorney, Agent, or Firm — Knobbe, Martens, Olson & Bear, LLP

(57) ABSTRACT

A packaged surface acoustic wave device is disclosed. The packaged surface acoustic wave device can include a support substrate that has a first side and a second side opposite the first side. The support substrate including a conductive via extending vertically between the first side to the second side. The packaged surface acoustic wave device can include a piezoelectric layer over the first side of the support substrate, an interdigital transducer electrode over the piezoelectric layer, a roof structure over the interdigital transducer electrode, and a conductive pillar between the first side of the support substrate and the roof structure. The conductive pillar supports the roof structure and defines at least a portion of an electrical pathway between the interdigital transducer electrode and the conductive via. A maximum horizontal dimension of the conductive pillar is greater than a maximum horizontal dimension of the conductive via.

20 Claims, 6 Drawing Sheets

Related U.S. Application Data filed on Aug. 27, 2021, provisional application No. 63/237,905, filed on Aug. 27, 2021.

(51) Int. Cl.
*H03H 9/02* (2006.01)
*H03H 9/10* (2006.01)
*H03H 9/145* (2006.01)
*H03H 9/64* (2006.01)

(52) U.S. Cl.
CPC ........ *H03H 9/1071* (2013.01); *H03H 9/1092* (2013.01); *H03H 9/145* (2013.01); *H03H 9/64* (2013.01)

(56) References Cited

U.S. PATENT DOCUMENTS

| | | | |
|---|---|---|---|
| 8,471,441 B2 | 6/2013 | Tsuda | |
| 8,531,254 B2 | 9/2013 | Yamaji et al. | |
| 8,975,803 B2 | 3/2015 | Fukano et al. | |
| 9,021,669 B2 | 5/2015 | Fukano | |
| 9,270,252 B2 | 2/2016 | Nishii et al. | |
| 9,312,230 B2 | 4/2016 | Chen et al. | |
| 9,831,849 B2 | 11/2017 | Lee | |
| 9,882,540 B2 | 1/2018 | Fukano | |
| 10,153,736 B2 | 12/2018 | King et al. | |
| 10,298,199 B2 | 5/2019 | Park et al. | |
| 10,333,493 B2 | 6/2019 | Nagarkar et al. | |
| 10,340,883 B2 | 7/2019 | Sugaya | |
| 10,483,942 B2 | 11/2019 | Goto et al. | |
| 10,944,377 B2 | 3/2021 | Hosagavi et al. | |
| 10,999,932 B2 | 5/2021 | Takano et al. | |
| 11,057,015 B2 | 7/2021 | Kawasaki | |
| 11,323,073 B2 | 5/2022 | King et al. | |
| 11,626,854 B2 | 4/2023 | Hosagavi et al. | |
| 11,757,426 B2 * | 9/2023 | Hsu | H01L 24/29 333/193 |
| 2017/0288123 A1 | 10/2017 | Hatano et al. | |
| 2017/0331455 A1 | 11/2017 | Kuroyanagi | |
| 2018/0013404 A1 | 1/2018 | Kawasaki et al. | |
| 2018/0159503 A1 | 6/2018 | Takano | |
| 2019/0019939 A1 | 1/2019 | Park et al. | |
| 2019/0393857 A1 | 12/2019 | Iwamoto | |
| 2020/0035654 A1 | 1/2020 | Chen et al. | |
| 2020/0076398 A1 | 3/2020 | Koo et al. | |
| 2020/0076399 A1 | 3/2020 | Koo et al. | |
| 2020/0076400 A1 | 3/2020 | Koo et al. | |
| 2020/0076402 A1 | 3/2020 | Koo et al. | |
| 2020/0112297 A1 | 4/2020 | Nomiya | |
| 2020/0168520 A1 | 5/2020 | Iwamoto | |
| 2020/0185354 A1 | 6/2020 | Iwamoto | |
| 2020/0212875 A1 | 7/2020 | Goto et al. | |
| 2020/0212883 A1 | 7/2020 | Goto et al. | |
| 2021/0013865 A1 | 1/2021 | Shih et al. | |
| 2021/0028767 A1 | 1/2021 | Sugaya | |
| 2021/0099157 A1 | 4/2021 | Takano et al. | |
| 2021/0159882 A1 | 5/2021 | Lee et al. | |
| 2023/0046261 A1 | 2/2023 | Yu et al. | |
| 2023/0062981 A1 | 3/2023 | Fukuhara et al. | |
| 2023/0069327 A1 | 3/2023 | Fukuhara et al. | |
| 2023/0361748 A1 | 11/2023 | Hosagavi et al. | |
| 2024/0171136 A1 | 5/2024 | Hosagavi et al. | |

FOREIGN PATENT DOCUMENTS

| | | |
|---|---|---|
| CN | 111371429 | 7/2020 |
| JP | 2008-245310 | 10/2008 |
| JP | 2016-066989 | 4/2016 |
| KR | 1336150 | 12/2013 |
| KR | 1354977 | 1/2014 |

* cited by examiner

PACKAGED SURFACE ACOUSTIC WAVE DEVICE WITH CONDUCTIVE ROOF SUPPORTING STRUCTURE

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/237,942, filed Aug. 27, 2021, titled "PACKAGED SURFACE ACOUSTIC WAVE DEVICE WITH CONDUCTIVE PILLAR," U.S. Provisional Patent Application No. 63/237,894, filed Aug. 27, 2021, titled "PACKAGED MULTILAYER PIEZOELECTRIC SURFACE ACOUSTIC WAVE DEVICE WITH CONDUCTIVE PILLAR," and U.S. Provisional Patent Application No. 63/237,905, filed Aug. 27, 2021, titled "PACKAGED SURFACE ACOUSTIC WAVE DEVICE WITH CONDUCTIVE ROOF SUPPORTING STRUCTURE," are hereby incorporated by reference under 37 CFR 1.57 in their entirety.

BACKGROUND

Technical Field

Embodiments of this disclosure relate to packaged surface acoustic wave devices.

Description of Related Technology

A surface acoustic wave filter can include a plurality of surface acoustic wave resonators arranged to filter a radio frequency signal. Each resonator can include a surface acoustic wave device. Surface acoustic wave filters can be implemented in radio frequency electronic systems. For instance, filters in a radio frequency front end of a mobile phone can include surface acoustic wave filters. A plurality of acoustic wave filters can be arranged as a multiplexer. For example, two surface acoustic wave filters can be arranged as a duplexer.

Surface acoustic wave devices can be enclosed within a package to protect the surface acoustic wave devices. The package can add to the size of a packaged surface acoustic wave device. There is a desire for smaller and thinner packaged surface acoustic wave devices.

SUMMARY

The innovations described in the claims each have several aspects, no single one of which is solely responsible for its desirable attributes. Without limiting the scope of the claims, some prominent features of this disclosure will now be briefly described.

In one aspect, a packaged surface acoustic wave device is disclosed. The packaged surface acoustic wave device can include a support substrate having a conductive via formed therein, a piezoelectric layer over the support substrate, an interdigital transducer electrode over the piezoelectric layer, a roof structure over the interdigital transducer electrode, and a conductive pillar disposed between the support substrate and the roof structure. The conductive pillar supports the roof structure and defines at least a portion of an electrical pathway between the interdigital transducer electrode and the conductive via.

In one embodiment, the roof structure is configured such that there is no signal communication between the conductive pillar and the roof structure.

In one embodiment, the roof structure does not include any electronic component mounted thereon.

In one embodiment, the roof structure and the support substrate includes the same material.

In one embodiment, the roof structure includes resin.

In one embodiment, the packaged surface acoustic wave device further includes a dielectric layer that is disposed between the support substrate and the piezoelectric layer.

In one embodiment, the packaged surface acoustic wave device further includes a conductive structure disposed between and connecting the interdigital transducer electrode and the conductive pillar. The packaged surface acoustic wave device can further include a second interdigital transducer electrode over the piezoelectric layer. The packaged surface acoustic wave device can further include a second conductive structure electrically connecting the interdigital transducer electrode and the second interdigital transducer electrode. The packaged surface acoustic wave device can further include a second conductive pillar that is disposed between the second conductive structure and the roof structure. The second conductive pillar can be configured to dissipate heat generated by the interdigital transducer electrode. The packaged surface acoustic wave device can further include a third conductive pillar supporting the roof structure relative to the support substrate and a third conductive structure electrically connecting the second interdigital transducer electrode and the third conductive pillar. The support substrate can include a second conductive via that is formed therein. The third conductive pillar can define at least a portion of an electrical pathway between the second interdigital transducer electrode and the second conductive via.

In one embodiment, the interdigital transducer electrode is positioned in a cavity defined between the support substrate and the roof structure. The cavity can be sealed by a cavity seal disposed laterally around the interdigital transducer electrode. The conductive pillar and the cavity seal can include the same material. The piezoelectric layer can be partially disposed over the support substrate.

In one embodiment, the conductive via extends vertically through the support substrate. A maximum horizontal dimension of the conductive pillar can be greater than a maximum horizontal dimension of the conductive via.

In one embodiment, the conductive pillar is positioned directly over the conductive via.

In one aspect, a packaged surface acoustic wave device is disclosed. The packaged surface acoustic wave device can include a multilayer piezoelectric substrate having a via formed therein. The multilayer piezoelectric substrate includes a support substrate and a piezoelectric layer over the support substrate. The packaged surface acoustic wave device can include an interdigital transducer electrode over the piezoelectric layer, a roof structure over the interdigital transducer electrode, and a conductive support structure disposed between the multilayer piezoelectric substrate and the roof structure. The conductive support structure supports the roof structure and defines at least a portion of an electrical pathway between the interdigital transducer electrode and the conductive via.

In one embodiment, the roof structure is configured such that there is no signal communication between the conductive support structure and the roof structure.

In one embodiment, the roof structure does not include any electronic component mounted thereon.

In one embodiment, the roof structure and the support substrate includes the same material.

In one embodiment, the packaged surface acoustic wave device further includes a dielectric layer that is disposed between the support substrate and the piezoelectric layer.

In one embodiment, the interdigital transducer electrode is positioned in a cavity defined between the support substrate and the roof structure. The cavity is sealed by a cavity seal disposed laterally around the interdigital transducer electrode.

In one aspect, a packaged surface acoustic wave device is disclosed. the packaged surface acoustic wave device can include a support substrate having a conductive via formed therein, a piezoelectric layer over the support substrate, an interdigital transducer electrode over the piezoelectric layer, a nonconductive roof structure over the interdigital transducer electrode, and a conductive pillar disposed between the support substrate and the nonconductive roof structure. The conductive pillar supporting the nonconductive roof structure, the conductive pillar is nonelectrically coupled with the roof structure.

In one embodiment, the conductive pillar defines at least a portion of an electrical pathway between the interdigital transducer electrode and the conductive via. The nonconductive roof structure can be configured such that there is no signal communication between the conductive pillar and the roof structure.

In one aspect, a packaged module is disclosed. The packaged module can include a substrate supporting at least one filter. The at least one filter includes one or more packaged surface acoustic wave device disclosed herein. The packaged module can be a radio frequency front end module. The packaged module can be a diversity receive module.

In one aspect, a wireless communication device is disclosed. the wireless communication device can include an antenna, a transceiver, and one or more of the packaged modules disclosed herein.

In one aspect, a packaged surface acoustic wave device is disclosed. The packaged surface acoustic wave device can include a support substrate having a conductive via formed therein, a piezoelectric layer over the support substrate, an interdigital transducer electrode over the piezoelectric layer, a roof structure over the interdigital transducer electrode, and a conductive pillar disposed directly over the conductive via. The conductive pillar supporting the roof structure.

In one embodiment, the conductive pillar defines at least a portion of a signal pathway between the interdigital transducer electrode and the conductive via.

In one embodiment, the roof structure is configured such that there is no signal communication between the conductive pillar and the roof structure.

In one embodiment, the roof structure does not include any electronic component mounted thereon.

In one embodiment, the roof structure and the support substrate includes the same material.

In one embodiment, the roof structure includes resin.

In one embodiment, the packaged surface acoustic wave device further includes a dielectric layer that is disposed between the support substrate and the piezoelectric layer.

In one embodiment, the packaged surface acoustic wave device further includes a conductive structure that is disposed between and connecting the interdigital transducer electrode and the conductive pillar. The packaged surface acoustic wave device can further include a second interdigital transducer electrode over the piezoelectric layer. The packaged surface acoustic wave device can further include a second conductive structure electrically connecting the interdigital transducer electrode and the second interdigital transducer electrode. The packaged surface acoustic wave device can further include a second conductive pillar disposed between the second conductive structure and the roof structure. The second conductive pillar can be configured to dissipate heat generated by the interdigital transducer electrode. The packaged surface acoustic wave device can further include a third conductive pillar supporting the roof structure relative to the support substrate and a third conductive structure electrically connecting the second interdigital transducer electrode and the third conductive pillar. The support substrate can include a second conductive via formed therein. The third conductive pillar can define at least a portion of an electrical pathway between the second interdigital transducer electrode and the second conductive via.

In one embodiment, the interdigital transducer electrode is positioned in a cavity defined between the support substrate and the roof structure. The cavity can be sealed by a cavity seal disposed laterally around the interdigital transducer electrode. The conductive pillar and the cavity seal can include the same material.

In one embodiment, the piezoelectric layer is partially disposed over the support substrate.

In one embodiment, the conductive via extends vertically through the support substrate. A maximum horizontal dimension of the conductive pillar can be greater than a maximum horizontal dimension of the conductive via.

In one aspect, a packaged surface acoustic wave device is disclosed. The packaged surface acoustic wave device can include a multilayer piezoelectric substrate having a first via and a second via formed therein. The multilayer piezoelectric substrate includes a support substrate and a piezoelectric layer over the support substrate. The packaged surface acoustic wave device can include first and second interdigital transducer electrodes over the piezoelectric layer, a roof structure over the first and second interdigital transducer electrodes, and first and second conductive support structures disposed directly over the first and second conductive vias respectively. The first conductive support structure supports the roof structure.

In one embodiment, the first conductive support structure defines at least a portion of a signal pathway between the first interdigital transducer electrode and the first conductive via.

In one embodiment, the roof structure is configured such that there is no signal communication between the first conductive support structure and the roof structure.

In one embodiment, the roof structure does not include any electronic component mounted thereon.

In one embodiment, the roof structure and the support substrate includes the same material.

In one embodiment, the conductive via extends vertically through the support substrate. A maximum horizontal dimension of the conductive support structure can be greater than a maximum horizontal dimension of the conductive via.

In one aspect, a packaged module is disclosed. The packaged module can include a substrate supporting at least one filter. The at least one filter including one or more packaged surface acoustic wave device disclosed herein.

In one embodiment, packaged module is a radio frequency front end module.

In one embodiment, the packaged module is a diversity receive module.

In one aspect, a wireless communication device is disclosed. The wireless communication device can include an antenna, a transceiver, and one or more of the packaged modules disclosed herein.

In one aspect, a packaged surface acoustic wave device is disclosed. The packaged surface caustic wave device can include a support substrate having a first side and a second side opposite the first side. The support substrate includes a conductive via extending vertically between the first side to the second side. The packaged surface acoustic wave device can include a piezoelectric layer over the first side of the support substrate, an interdigital transducer electrode over the piezoelectric layer, a roof structure over the interdigital transducer electrode, and a conductive pillar disposed between the first side of the support substrate and the roof structure. The conductive pillar supports the roof structure. A maximum horizontal dimension of the conductive pillar is greater than a maximum horizontal dimension of the conductive via.

In one embodiment, the conductive pillar defines at least a portion of an electrical pathway between the interdigital transducer electrode and the conductive via.

In one embodiment, the maximum horizontal dimension of the conductive pillar is at least three times greater than the maximum horizontal dimension of the conductive via.

In one embodiment, the roof structure is configured such that there is no signal communication between the conductive pillar and the roof structure.

In one embodiment, the roof structure does not include any electronic component mounted thereon.

In one embodiment, the roof structure and the support substrate includes the same material.

In one embodiment, the roof structure includes resin.

In one embodiment, the packaged surface acoustic wave device further includes a dielectric layer that is disposed between the support substrate and the piezoelectric layer.

In one embodiment, the packaged surface acoustic wave device further includes a conductive structure that is disposed between and connecting the interdigital transducer electrode and the conductive pillar. The packaged surface acoustic wave device can further include a second interdigital transducer electrode over the piezoelectric layer. The packaged surface acoustic wave device can further include a second conductive structure electrically connecting the interdigital transducer electrode and the second interdigital transducer electrode. The packaged surface acoustic wave device can further include a second conductive pillar disposed between the second conductive structure and the roof structure. The second conductive pillar can be configured to dissipate heat generated by the interdigital transducer electrode. The packaged surface acoustic wave device can further include a third conductive pillar supporting the roof structure relative to the support substrate and a third conductive structure electrically connecting the second interdigital transducer electrode and the third conductive pillar. The support substrate can include a second conductive via formed therein. The third conductive pillar can define at least a portion of an electrical pathway between the second interdigital transducer electrode and the second conductive via.

In one embodiment, the interdigital transducer electrode is positioned in a cavity defined between the support substrate and the roof structure. The cavity can be sealed by a cavity seal disposed laterally around the interdigital transducer electrode. The conductive pillar and the cavity seal can include the same material.

In one embodiment, the piezoelectric layer is partially disposed over the support substrate.

In one embodiment, the conductive via extends vertically through the support substrate, and a maximum horizontal dimension of the conductive pillar being greater than a maximum horizontal dimension of the conductive via.

In one embodiment, the conductive pillar is positioned directly over the conductive via.

In one aspect, a packaged surface acoustic wave device is disclosed. The packaged surface acoustic wave device can include a multilayer piezoelectric substrate having a first side and a second side opposite the first side. The support substrate includes a conductive a via extending vertically between the first side to the second side. The multilayer piezoelectric substrate includes a support substrate and a piezoelectric layer over the support substrate. The packaged surface acoustic wave device can include an interdigital transducer electrode over the piezoelectric layer, a roof structure over the interdigital transducer electrode, and a conductive support structure disposed between the multilayer piezoelectric substrate and the roof structure. The conductive support structure supports the roof structure. A maximum horizontal dimension of the conductive pillar is greater than a maximum horizontal dimension of the conductive via.

In one embodiment, the conductive support structure defines at least a portion of an electrical pathway between the interdigital transducer electrode and the conductive via In one embodiment, the roof structure does not include any electronic component mounted thereon.

In one embodiment, the roof structure and the support substrate includes the same material.

In one embodiment, the packaged surface acoustic wave device further includes a dielectric layer disposed between the support substrate and the piezoelectric layer.

In one embodiment, the interdigital transducer electrode is positioned in a cavity defined between the support substrate and the roof structure, the cavity is sealed by a cavity seal disposed laterally around the interdigital transducer electrode.

In one aspect, a packaged module is disclosed. the packaged module can include a substrate supporting at least one filter. The at least one filter including one or more packaged surface acoustic wave device disclosed herein.

In one embodiment, packaged module is a radio frequency front end module.

In one embodiment, the packaged module is a diversity receive module.

In one aspect, a wireless communication device is disclosed. the wireless communication device can include an antenna, a transceiver, and one or more of the packaged modules disclosed herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/816,982, titled "PACKAGED SURFACE ACOUSTIC WAVE DEVICE WITH CONDUCTIVE PILLAR," filed on Aug. 2, 2022, and U.S. patent application Ser. No. 17/816,975, titled "PACKAGED MULTILAYER PIEZOELECTRIC SURFACE ACOUSTIC WAVE DEVICE WITH CONDUCTIVE PILLAR," filed on Aug. 2, 2022, the entire disclosure of which are hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
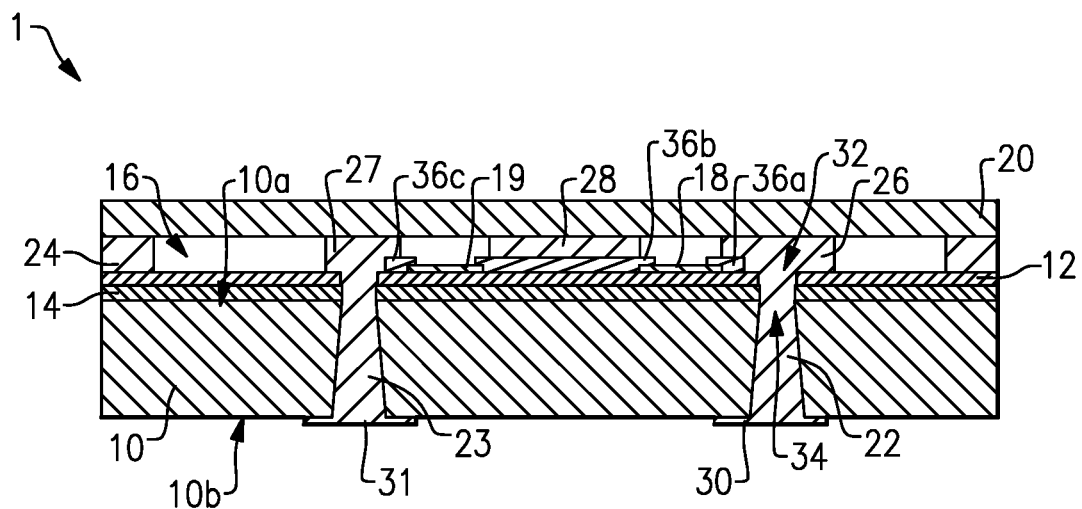
FIG. 1A is a schematic cross sectional side view of a packaged surface acoustic wave device, according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A packaged surface acoustic wave (SAW) device includes a piezoelectric substrate and an interdigital transducer (IDT) electrode on the piezoelectric substrate. The IDT electrode can be disposed in a cavity that is defined over a portion of a surface of the piezoelectric layer. The packaged SAW device includes a cavity pillar formed on the surface of the piezoelectric layer, and a cavity roof disposed on the cavity pillar. The packaged SAW device also includes conductive pads and a ground connection over the cavity roof. The packaged SAW device also includes electrically conductive features (e.g., a metal trace, a metal plate, a conductive via etc.) that can route electrical connections (e.g., signals, ground or power) from/to the IDT electrode to/from the conductive pads and the ground connection. However, due to its structural limitations, such packaged SAW device has a relatively low heat dissipation property, a relatively low mechanical ruggedness, and/or a relatively low electrical performance.

Aspects of this disclosure relate to packaged SAW devices that have improved heat dissipation property, improved mechanical ruggedness, and improved electrical performance. A SAW device according to some embodiments can include a multilayer piezoelectric substrate (MPS) structure. The SAW device can include a support substrate, a piezoelectric layer over the support substrate, a dielectric layer between the support substrate and the piezoelectric layer, a cavity formed over the piezoelectric layer, an IDT electrode on the piezoelectric layer and disposed in the cavity, a roof structure over the cavity, and a conductive via that extends through the support substrate and electrically connected to the IDT electrode. In some embodiments, the conductive via can also extend through the dielectric layer and/or the piezoelectric layer. The packaged SAW device can include a roof support structure. The roof support structure can include a cavity seal and a conductive pillar. The conductive pillar can be a metal pillar. The conductive pillar is preferably electrically and thermally conductive.

Figure 1B:
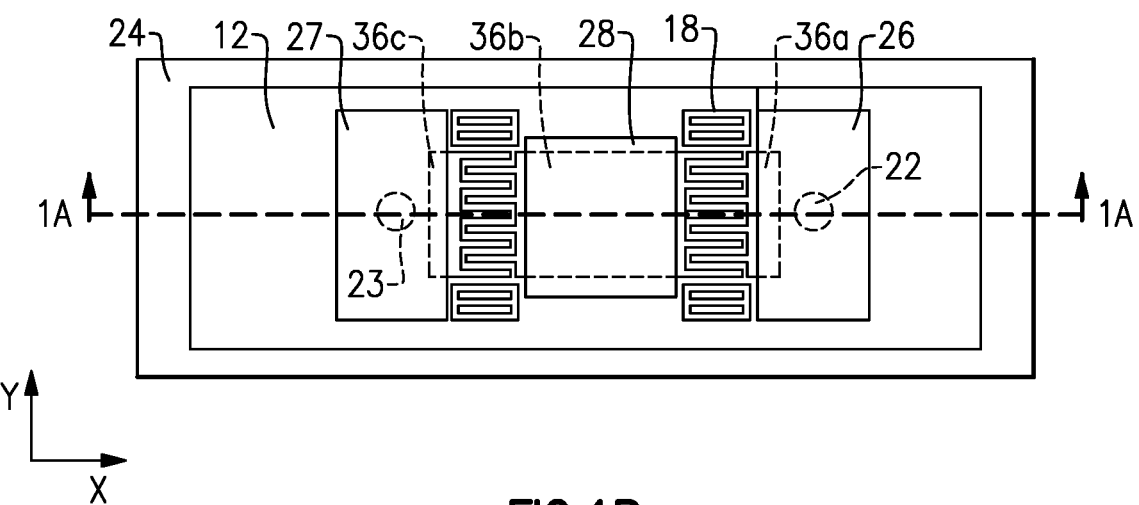
FIG. 1B is a schematic top plan view of the packaged surface acoustic wave device of FIG. 1A.

FIG. 1A is a schematic cross sectional side view of a packaged surface acoustic wave (SAW) device 1, according to an embodiment. FIG. 1B is a schematic top plan view of the packaged SAW device 1 of FIG. 1A. The SAW device 1 can include a support substrate 10, a piezoelectric layer 12 over the support substrate 10, a dielectric layer 14 between the support substrate 10 and the piezoelectric layer 12, a cavity 16 formed over the piezoelectric layer 12, an IDT electrode 18 on the piezoelectric layer 12 and disposed in the cavity 16, a roof structure 20 over the cavity 16, and a conductive via 22 that extends through the support substrate 10 and electrically connected to the IDT electrode 18. In FIG. 1B, the roof structure 20 is not illustrated to show internal components of the packaged SAW device 1. In some embodiments, the conductive via 22 can also extend through the dielectric layer 14 and/or the piezoelectric layer 12. The packaged SAW device 1 can include a roof support structure. The roof support structure can include a cavity seal 24, a first conductive pillar 26, a second conductive pillar 28, and a third conductive pillar 27.

In some embodiments, the support substrate 10 can be a single crystal layer. In some embodiments, the support substrate 10 can be a silicon support substrate. In some other embodiments, the support substrate 10 can include, for example, sapphire, aluminum oxide ($Al_2O_3$), aluminum nitride (AlN), ceramic material, quartz etc. The support substrate 10 can have a high impedance relative to the piezoelectric layer 12 and high thermal conductivity. For example, the support substrate 10 can have a higher impedance than an impedance of the piezoelectric layer 12 and a higher thermal conductivity than a thermal conductivity of the piezoelectric layer 12.

The support substrate 10 can have an upper side 10a and a bottom side 10b. The conductive via 22 can extend through the support substrate 10 between the upper side 10a and the bottom side 10b. In some embodiments, the packaged SAW device 1 can include a plurality of conductive vias. For example, the packaged SAW device 1 can include a second conductive via 23. The second conductive via 23 can be the same as or generally similar to the conducive via 22. The conductive via 22 can be a filled via or a conformal via. The conductive via 22 is electrically conductive. The conductive via 22 can have a relatively high thermal conductivity. In some embodiments, the conductive via 22 can be more thermally conductive than the support substrate 10 and/or the piezoelectric layer 12. The packaged SAW device 1 can include an external terminal 30 at the bottom side 10b of the support substrate 10. In some embodiments, the packaged SAW device 1 can include a plurality of external terminal 30. For example, the packaged SAW device 1 can include a second external terminal 31. The second external terminal 31 can be the same as or generally similar to the external terminal 30. The external terminal 30 can be connected with the conductive via 22, and configured to connect to an external device or substrate (not shown). The external terminal 30 can electrically connect the packaged SAW device 1 to the external device or substrate. In some embodiments, the external terminal 30 can be a metal pad.

The piezoelectric layer 12 can be any suitable piezoelectric layer, such as a lithium based piezoelectric layer. In some embodiments, the piezoelectric layer 12 can be a lithium tantalate (LT) layer. In some other embodiments, the piezoelectric layer 12 can be a lithium niobate (LN) layer. The piezoelectric layer 12 can have an opening 32. The opening 32 can be a through hole through the piezoelectric layer 12. At least a portion of the conductive via 22 can be disposed in the opening 32.

In some embodiments, the dielectric layer 14 can act as an adhesive layer. The dielectric layer 14 can include any suitable material. The dielectric layer 14 can be, for example, an oxide layer (e.g., a silicon dioxide ($SiO_2$) layer). The dielectric layer 14 can have an opening 34. The opening 34 can be a through hole through a thickness of the dielectric layer 14. At least a portion of the conductive via 22 can be disposed in the opening 34.

In some embodiments, the cavity 16 can be filled with gas. For example, the cavity 16 can be an air cavity. The cavity 16 can be sealed by the cavity seal 24. The cavity seal 24 can, completely or at least partially, horizontally surround the cavity 16 between the piezoelectric layer 12 and the roof structure 20. In some embodiments, the cavity 16 can be hermetically sealed from outside environs. The cavity seal 24 can mechanically support the roof structure 20. In some embodiments, the cavity seal 24 can include the same material as the first conductive pillar 26, the second conductive pillar 28, and/or the third conductive pillar 27. The cavity seal 24 can include any suitable material, such as a metal (e.g., copper) or non-metal (e.g., an epoxy).

In some embodiments, the packaged SAW device 1 can include a plurality of IDT electrodes over the piezoelectric layer 12. For example, the packaged SAW device 1 can include a second IDT electrode 19. The second IDT electrode 19 can be the same as or generally similar to the IDT electrode 18. In some embodiments, the IDT electrode 18 and/or the second IDT electrode 19 can include aluminum (Al). The IDT electrode 18 and/or the second IDT electrode 19 may include other metals, such as, molybdenum (Mo), copper (Cu), Magnesium (Mg), tungsten (W), gold (Au), silver (Ag), copper (Cu), platinum (Pt), ruthenium (Ru), titanium (Ti), etc. The IDT electrode 18 and/or the second IDT electrode 19 may include alloys, such as AlMgCu, AlCu, etc. In some embodiments, the IDT electrode 18 and/or the second IDT electrode 19 can have a multi-layer IDT electrode structure.

In some embodiments, the packaged SAW device 1 can include a first conductive structure 36a that electrically connects the IDT electrode 18 to the conductive via 22, a second conductive structure 36b that electrically connects the IDT electrode 18 to the second IDT electrode 19, and a third conductive structure 36c that electrically connects the second IDT electrode 19 to the second conductive via 23. The first conductive structure 36a, the second conductive structure 36b, and/or the third conductive structure 36c can be a thin metal layer formed on the piezoelectric layer 12. In some embodiments, the first conductive pillar 26 can be disposed between the conductive via 22 and the first conductive structure 36a, and the third conductive pillar 27 can be disposed between the conductive via 23 and the third conductive structure 36c. The second conductive pillar 28 can be disposed between the second conductive structure 36b and the roof structure 20. The first conductive pillar 26, the second conductive pillar 28, and the third conductive pillar 27 can be configured to mechanically support the roof structure 20. The first conductive pillar 26, the second conductive pillar 28, and the third conductive pillar 27 can have a relatively high thermal conductivity. For example, the first conductive pillar 26, the second conductive pillar 28, and the third conductive pillar 27 can be more thermally conductive than the support substrate 10 and/or the piezoelectric layer 12. The first conductive pillar 26, the second conductive pillar 28, and the third conductive pillar 27 can be metal pillars.

The conductive via 22, the external terminal 30, the first conductive pillar 26, and the first conductive stricture 36a can at least partially provide electrical connections (e.g., signals, ground or power) between the IDT electrode 18 and the external device or substrate. The conductive via 22, the external terminal 30, the first conductive pillar 26, and the first conductive stricture 36a can also define a thermal pathway for dissipating heat generated by the IDT electrode 18. Similarly, the second conductive via 23, the second external terminal 31, the third conductive pillar 27, and the third conductive stricture 36c can at least partially provide electrical connections (e.g., signals, ground or power) between the second IDT electrode 19 and the external device or substrate. The second conductive via 23, the second external terminal 31, the third conductive pillar 27, and the third conductive stricture 36c can also define a thermal pathway for dissipating heat generated by the second IDT electrode 19.

In some embodiments, the first conductive pillar 26, the second conductive pillar 28, and the third conductive pillar 27 are not configured to provide electrical communication between the IDT electrode 18 and/or the second IDT electrode 19 and the roof structure 20. In some embodiments, the roof structure 20 is configured such that there is no signal communication between the first conductive pillar 26, the second conductive pillar 28, or the third conductive pillar 27 and the roof structure 20. For example, the roof structure 20 is not electrically connected with the first conductive pillar 26, the second conductive pillar 28, and/or the third conductive pillar 27.

The roof structure 20 can include any suitable material. In some embodiments, the roof structure 20 and the support substrate 10 can have the same material, or a material with the same or generally similar thermal characteristics. Selecting the material of the roof structure 20 to be the same as or generally similar to the material of the support substrate 10 may provide a more durable and/or stable structure for the packaged SAW device 1 than using different materials for the roof structure 20 and the support substrate 10. In some embodiments, the roof structure 20 can include quartz, silicon, sapphire, or the like materials.

In some embodiments, the roof structure 20 can be nonconductive. For example, the roof structure 20 can be nonconductive such that the first conductive pillar 26, the second conductive pillar 28, and the third conductive pillar 27 are not electrically connected to the roof structure 20. In some embodiments, the roof structure 20 can include epoxy. For example, the roof structure 20 can include epoxy and an enforcement structure formed therein. A thickness of the roof structure 20 can be determined at least in part by the structural strength of the roof structure 20. For example, the thickness of the roof structure 20 can be sufficiently thick to mechanically protect the components, such as the IDT electrode 18, in the cavity 16. In some applications, the packaged SAW device 1 can be overmolded after assembly. In such applications, the roof structure 20 can be sufficiently thick to mechanically support the molding material. The thickness of the roof structure 20 can be determined at least in part by the characteristics of the support substrate 10. For example, the thicknesses of the support substrate 10 and the roof structure 20 can be set so as to maintain a particular overall device thickness of the packaged SAW device 1.

In the illustrated embodiments, the conductive via 22 and the first conductive pillar 26 extends along a Z direction. In some embodiments, a maximum cross-sectional area of the first conductive pillar 26 along an X-Y plane traverse to the Z direction can be greater than a maximum cross-sectional area of the conductive via 22 along the X-Y plane. In some embodiments, the maximum horizontal cross-sectional area of the first conductive pillar 26 (along the X-Y plane) can be, for example, at least two times, three times, five times, or ten times greater than a maximum horizontal cross-sectional area of the conductive via 22 (along the X-Y plane). In some embodiments, a maximum horizontal dimension of the first conductive pillar 26 (along the X-Y plane) can be greater than a maximum horizontal dimension of the conductive via 22 (along the X-Y plane). For example, the maximum horizontal dimension of the conductive pillar 26 can be two times, three times, five times, or ten times greater than the maximum horizontal dimension of the conductive via 22. As shown in FIGS. 1A and 1B, in some embodiments, the first conductive pillar 26 can be directly over the conductive via 22. However, in some embodiments, the first conductive pillar 26 can be offset relative to the conductive via 22 horizontally along the X-Y plane. In some embodiments, the first conductive pillar 26 can at least partially overlap a bus bar of the IDT electrode 18.

Figure 2:
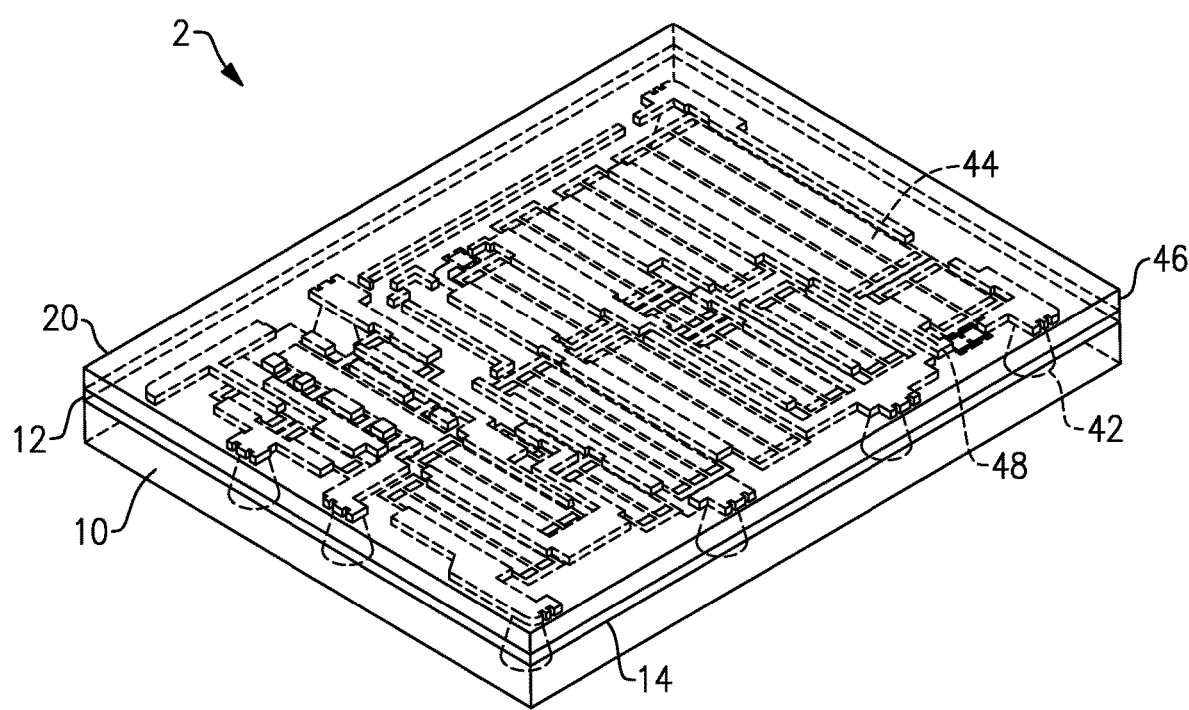
FIG. 2 is a schematic perspective view of a packaged surface acoustic wave device according to an embodiment.

FIG. 2 is a schematic perspective view of a packaged SAW device 2 according to an embodiment. The packaged SAW device 2 can include a support substrate 10, a piezoelectric layer 12, and a dielectric layer 14. The packaged SAW device 2 can include a plurality of conductive vias 42 through portions of the support substrate 10 and a plurality of IDT electrodes 44 on the piezoelectric layer 12. The packaged SAW deice 2 can include a roof structure 20, and a roof support structure. The roof support structure can include a cavity seal 46 and a plurality of conductive pillars 48. Unless otherwise noted, components of the packaged SAW device 2, may be the same as or generally similar to like components of the packaged SAW device 1.

As shown in FIG. 2, the plurality of conductive pillars 48 can be located at various locations on the piezoelectric layer 12. The plurality of conductive pillars 48 can provide mechanical support for the roof structure 20 and at least partially provide electrical communication between the plurality of IDT electrodes 44 and the corresponding plurality of conductive vias 42.

Figure 3A:
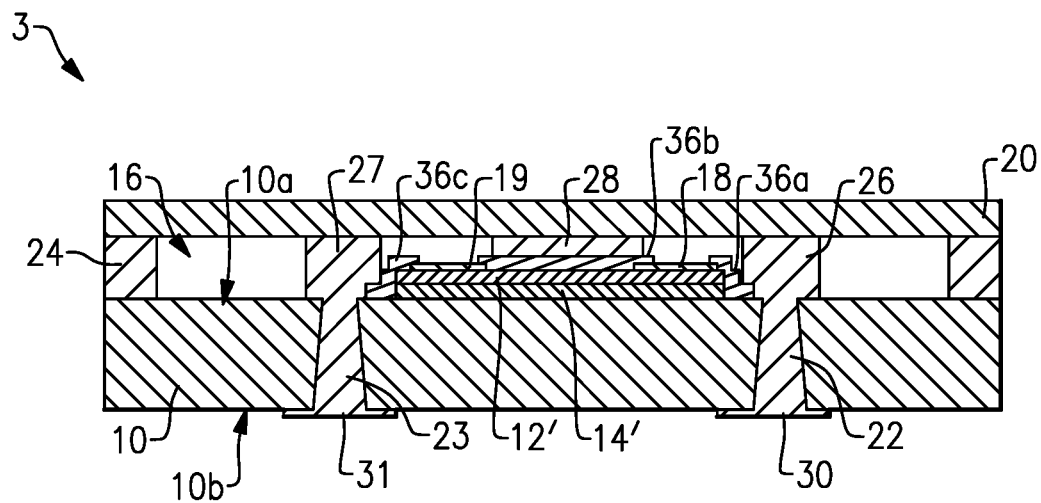
FIG. 3A is a schematic cross sectional side view of a packaged surface acoustic wave device according to an embodiment.
Figure 3B:
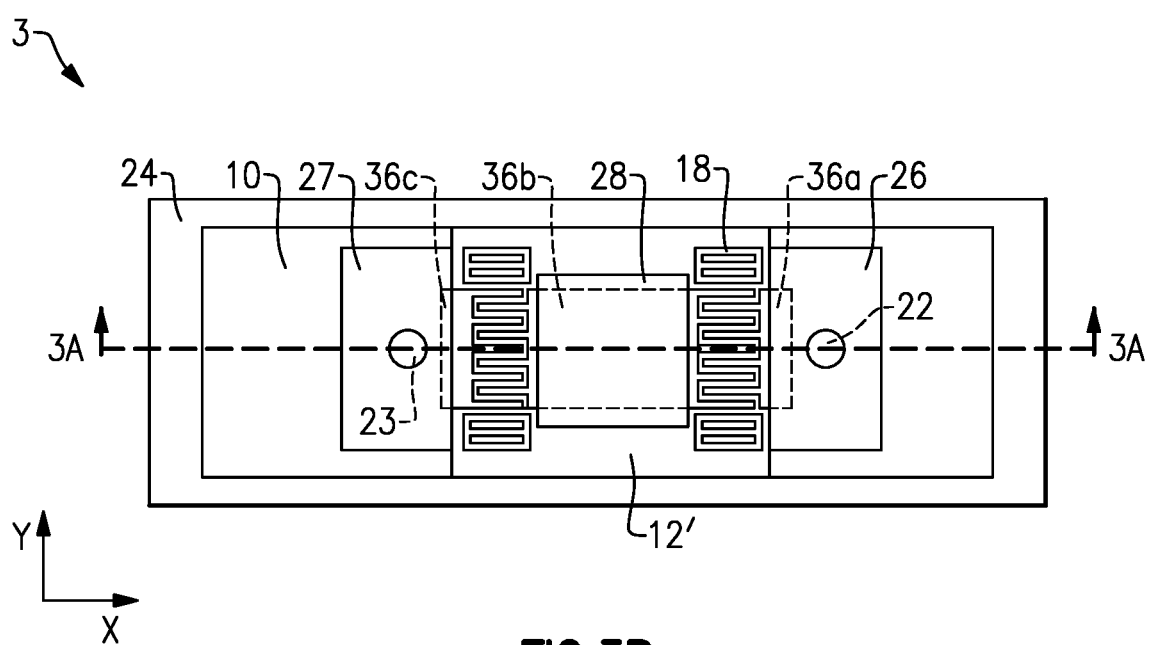
FIG. 3B is a schematic top plan view of the packaged surface acoustic wave device of FIG. 3A.

FIG. 3A is a schematic cross sectional side view of a packaged SAW device 3 according to an embodiment. FIG. 3B is a schematic top plan view of the packaged SAW device 3 of FIG. 3A. The SAW device 3 can include a support substrate 10, a piezoelectric layer 12' over the support substrate 10, a dielectric layer 14' between the support substrate 10 and the piezoelectric layer 12', a cavity 16 formed over the piezoelectric layer 12', an IDT electrode 18 on the piezoelectric layer 12' and disposed in the cavity 16, a roof structure 20 over the cavity 16, and a conductive via 22 that extends through the support substrate 10 and electrically connect to the IDT electrode 18. The support substrate 10 can have an upper side 10a and a bottom side 10b. In FIG. 3B, the roof structure 20 is not illustrated to show internal components of the packaged SAW device 3. The packaged SAW device 3 can include a roof support structure. The roof support structure can include a cavity seal 24, a first conductive pillar 26, a second conductive pillar 28, and a third conductive pillar 27. Unless otherwise noted, components of the packaged SAW device 3, may be the same as or generally similar to like components of the packaged SAW devices 1 and 2.

The packaged SAW device 3 is generally similar to the packaged SAW device 1 of FIGS. 1A and 1B, except that the piezoelectric layer 12' and the dielectric layer 14' of the SAW device 3 are formed on a smaller portion of the upper side 10a of the support substrate 10 than the piezoelectric layer 12 and the dielectric layer 14 of the SAW device 1. The piezoelectric layer 12' can be selectively disposed over the support substrate 10 so as to be present at least under locations of the IDT electrodes 18, 19. In other words, the piezoelectric layer 12' can be selectively disposed at locations where the piezoelectric layer 12' is used to propagate acoustic waves that are generated by the IDT electrodes 18, 19. In some embodiments, certain portions over the upper side 10a of the support substrate 10 can be free from the piezoelectric layer 12' and/or the dielectric layer 14'. For example, portions of piezoelectric layer 12 and/or the dielectric layer 14 can be removed (e.g., etched) to leave the piezoelectric layer 12' and/or the dielectric layer 14'.

In some applications, the packaged SAW device 3 can beneficially reduce stress propagated to the piezoelectric layer 12' due to thermal expansion within the packaged SAW device 3. For example, the piezoelectric layer 12' can be separated and/or isolated from the conductive via 22 and/or the first conductive pillar 26 by the first conductive stricture 36a.

A method for forming the first conductive pillar 26, the second conductive pillar 28, and/the third conductive pillar 27 can include pattering a resist layer, forming a metal seed layer (e.g., a copper seed layer), providing a metal (e.g., copper), and removing the resist layer. The conductive via 22 can be formed by a via first process or a via last process.

Though certain descriptions in this application may be focused on multilayer piezoelectric substrate (MPS) SAW structures, any suitable principles and advantages disclosed herein can be utilized in other structures, such as a temperature compensated (TC) SAW structure.

The packaged surface acoustic wave devices disclosed herein can be implemented in a variety of applications, such as standalone surface acoustic wave filters, in radio frequency modules, or the like. Radio frequency modules that include packaged surface acoustic wave device in accordance with any suitable principles and advantages disclosed herein can also include one or more of a power amplifier, a radio frequency switch, a low noise amplifier, an inductor, or the like. Such radio frequency modules can benefit from reduced height and/or size of the packaged surface acoustic wave device.

Figure 4:
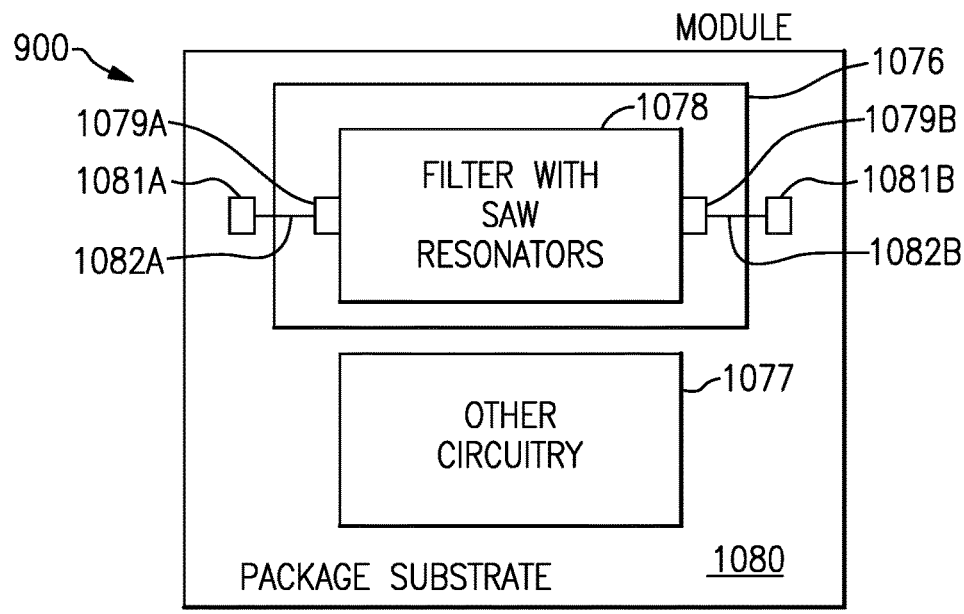
FIG. 4 is a schematic diagram of a radio frequency module that includes a filter with SAW resonators according to an embodiment.

FIG. 4 is a schematic diagram of a radio frequency module 900 that includes a surface acoustic wave component 1076 according to an embodiment. The illustrated radio frequency module 900 includes the SAW component 1076 and other circuitry 1077. The SAW component 1076 can include one or more packaged SAW filters with any suitable combination of features of the SAW packages disclosed herein.

The SAW component 1076 shown in FIG. 4 includes a filter 1078 and terminals 1079A and 1079B. The filter 1078 includes SAW resonators, and may be packaged in accordance with any suitable principles and advantages disclosed herein. The terminals 1079A and 1079B can serve, for example, as an input contact and an output contact, and may extend through a buffer coat resin insulation layer. The SAW component 1076 and the other circuitry 1077 are on or supported by a common packaging substrate 1080 in FIG. 4. The package substrate 1080 can be a laminate substrate. The terminals 1079A and 1079B can be electrically connected to contacts 1081A and 1081B, respectively, on or supported by the packaging substrate 1080 by way of electrical connectors 1082A and 1082B, respectively. The electrical connectors 1082A and 1082B can be bumps or wire bonds, for example. The other circuitry 1077 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 900 can include one or more packaging structures to, for example, provide protection and/or facilitate easier handling of the radio frequency module 900. Such a packaging structure can include an overmold structure formed over the packaging substrate 1080. The overmold structure can encapsulate some or all of the components of the radio frequency module 900.

Figure 5:
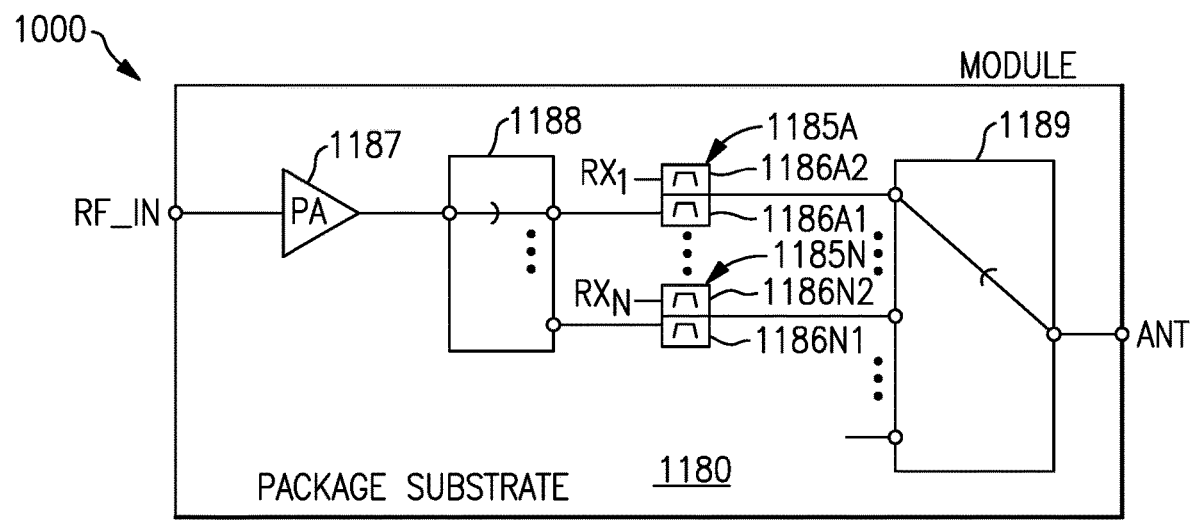
FIG. 5 is a schematic diagram of a radio frequency module that includes duplexers with surface acoustic wave resonators according to an embodiment.

FIG. 5 is a schematic diagram of a radio frequency module 1000 that includes a packaged surface acoustic wave component according to an embodiment. As illustrated, the radio frequency module 1000 includes duplexers 1185A to 1185N that include respective transmit filters 1186A1 to 1186N1 and respective receive filters 1186A2 to 1186N2, a power amplifier 1187, a select switch 1188, and an antenna switch 1189. The radio frequency module 1000 can include a package that encloses the illustrated elements. The illustrated elements can be disposed on a common packaging substrate 1180. The packaging substrate can be a laminate substrate, for example.

The duplexers 1185A to 1185N can each include two acoustic wave filters coupled to a common node. The two acoustic wave filters can be a transmit filter and a receive filter, and may be packaged with one another as discussed herein. As illustrated, the transmit filter and the receive filter can each be band pass filters arranged to filter a radio frequency signal. A packaged SAW device in accordance with any suitable principles and advantages disclosed herein can include one or more SAW resonators of one or more of the transmit filters 1186A1 to 1186N1 and/or one or more of the receive filters 1186A2 to 1186N2. Although FIG. 5 illustrates duplexers, any suitable principles and advantages disclosed herein can be implemented in other multiplexers (e.g., quadplexers, hexaplexers, octoplexers, etc.) and/or in switch-plexers.

The power amplifier 1187 can amplify a radio frequency signal. The illustrated switch 1188 is a multi-throw radio frequency switch. The switch 1188 can electrically couple an output of the power amplifier 1187 to a selected transmit filter of the transmit filters 1186A1 to 1186N1. In some instances, the switch 1188 can electrically connect the output of the power amplifier 1187 to more than one of the transmit filters 1186A1 to 1186N1. The antenna switch 1189 can selectively couple a signal from one or more of the duplexers 1185A to 1185N to an antenna port ANT. The duplexers 1185A to 1185N can be associated with different frequency bands and/or different modes of operation (e.g., different power modes, different signaling modes, etc.).

Figure 6:
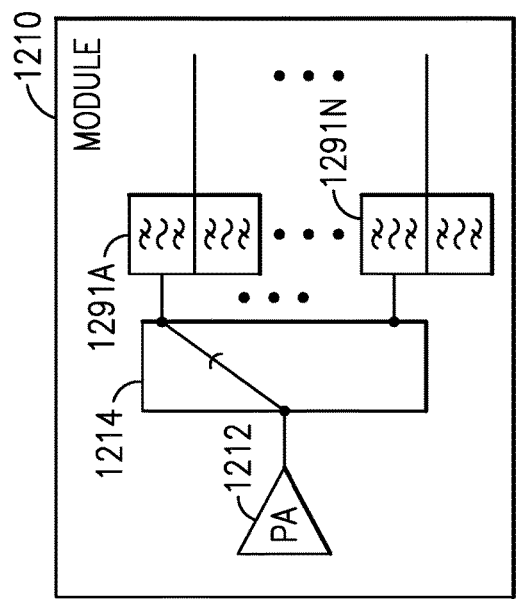
FIG. 6 is a schematic block diagram of a module that includes a power amplifier, a radio frequency switch, and duplexers that include one or more surface acoustic wave resonators according to an embodiment.

FIG. 6 is a schematic block diagram of a module 1210 that includes a power amplifier 1212, a radio frequency switch 1214, and duplexers 1291A to 1291N in accordance with one or more embodiments. The power amplifier 1212 can amplify a radio frequency signal. The radio frequency switch 1214 can be a multi-throw radio frequency switch. The radio frequency switch 1214 can electrically couple an output of the power amplifier 1212 to a selected transmit filter of the duplexers 1291A to 1291N. A packaged SAW device in accordance with any suitable principles and advantages disclosed herein can include one or more SAW resonators of one or more filters of the duplexers 1291A to 1291N and/or one or more of duplexers 1291A to 1291N.

Figure 7:
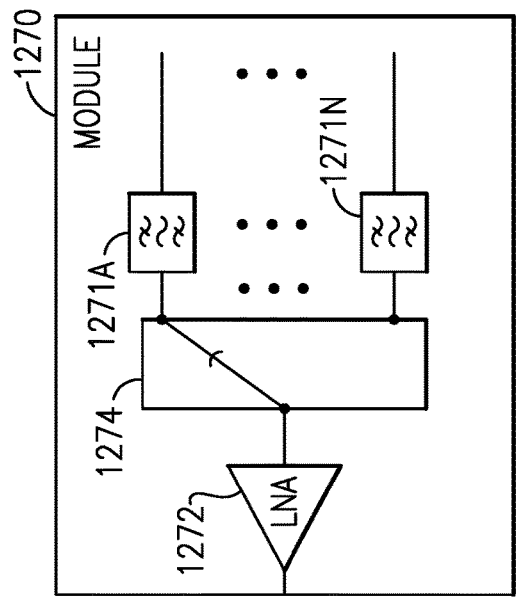
FIG. 7 is a schematic block diagram of a module that includes a low noise amplifier, a radio frequency switch, and surface acoustic wave filters according to an embodiment.

FIG. 7 is a schematic block diagram of a module 1270 that includes filters 1271A to 1271N, a radio frequency switch 1274, and a low noise amplifier 1272 according to an embodiment. A packaged SAW device in accordance with any suitable principles and advantages disclosed herein can include one or more SAW resonators of one or more filters of the filters 1271A to 1271N. Some or all of the filters may be packaged as discussed herein. Any suitable number of filters 1271A to 1271N can be implemented. The illustrated filters 1271A to 1271N are receive filters. In some embodiments (not illustrated), one or more of the filters 1271A to 1271N can be included in a multiplexer that also includes a transmit filter. The radio frequency switch 1274 can be a multi-throw radio frequency switch. The radio frequency switch 1274 can electrically couple an output of a selected filter of filters 1271A to 1271N to the low noise amplifier 1272. In some embodiments (not illustrated), a plurality of low noise amplifiers can be implemented. The module 1270 can include diversity receive features in certain applications.

Figure 8:
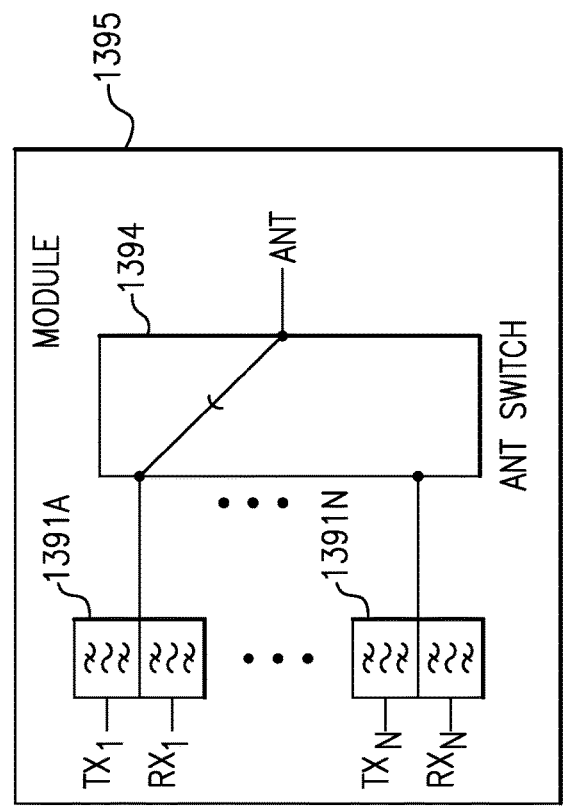
FIG. 8 is a schematic block diagram of a module that includes an antenna switch and duplexers that include one or more surface acoustic wave resonators according to an embodiment.

FIG. 8 is a schematic block diagram of a module 1395 that includes duplexers 1391A to 1391N and an antenna switch 1394. One or more filters of the duplexers 1391A to 1391N can be packaged as described herein and may include any suitable number of surface acoustic wave resonators, in accordance with any suitable principles and advantages discussed herein. Any suitable number of duplexers 1391A to 1391N can be implemented. The antenna switch 1394 can have a number of throws corresponding to the number of duplexers 1391A to 1391N. The antenna switch 1394 can electrically couple a selected duplexer to an antenna port of the module 1395.

Figure 9:
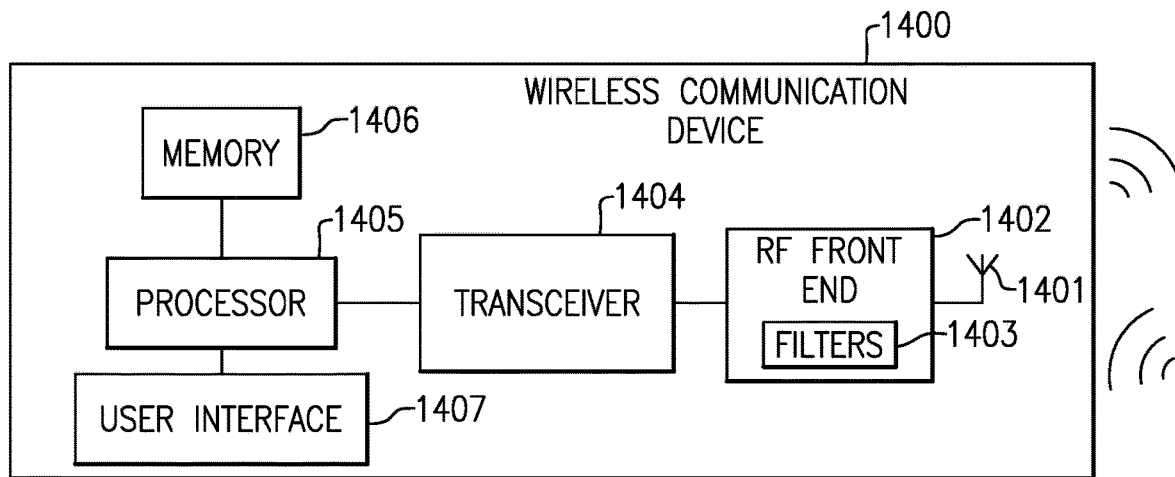
FIG. 9 is a schematic block diagram of a wireless communication device that includes a surface acoustic wave filter in accordance with one or more embodiments.

FIG. 9 is a schematic diagram of a wireless communication device 1400 that includes filters 1403 in a radio frequency front end 1402 according to an embodiment. The filters 1403 can include one or more SAW resonators in accordance with any suitable principles and advantages discussed herein. The wireless communication device 1400 can be any suitable wireless communication device. For instance, a wireless communication device 1400 can be a mobile phone, such as a smart phone. As illustrated, the wireless communication device 1400 includes an antenna 1401, an RF front end 1402, a transceiver 1404, a processor 1405, a memory 1406, and a user interface 1407. The antenna 1401 can transmit RF signals provided by the RF front end 1402. Such RF signals can include carrier aggregation signals. Although not illustrated, the wireless communication device 1400 can include a microphone and a speaker in certain applications.

The RF front end 1402 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 1402 can transmit and receive RF signals associated with any suitable communication standards. The filters 1403 may be packaged with one another, or with a subset of the filters 1403, and can include packaged SAW devices including any suitable combination of features discussed with reference to any embodiments discussed herein.

The transceiver 1404 can provide RF signals to the RF front end 1402 for amplification and/or other processing. The transceiver 1404 can also process an RF signal provided by a low noise amplifier of the RF front end 1402. The transceiver 1404 is in communication with the processor 1405. The processor 1405 can be a baseband processor. The processor 1405 can provide any suitable base band processing functions for the wireless communication device 1400. The memory 1406 can be accessed by the processor 1405. The memory 1406 can store any suitable data for the wireless communication device 1400. The user interface 1407 can be any suitable user interface, such as a display with touch screen capabilities.

Figure 10:
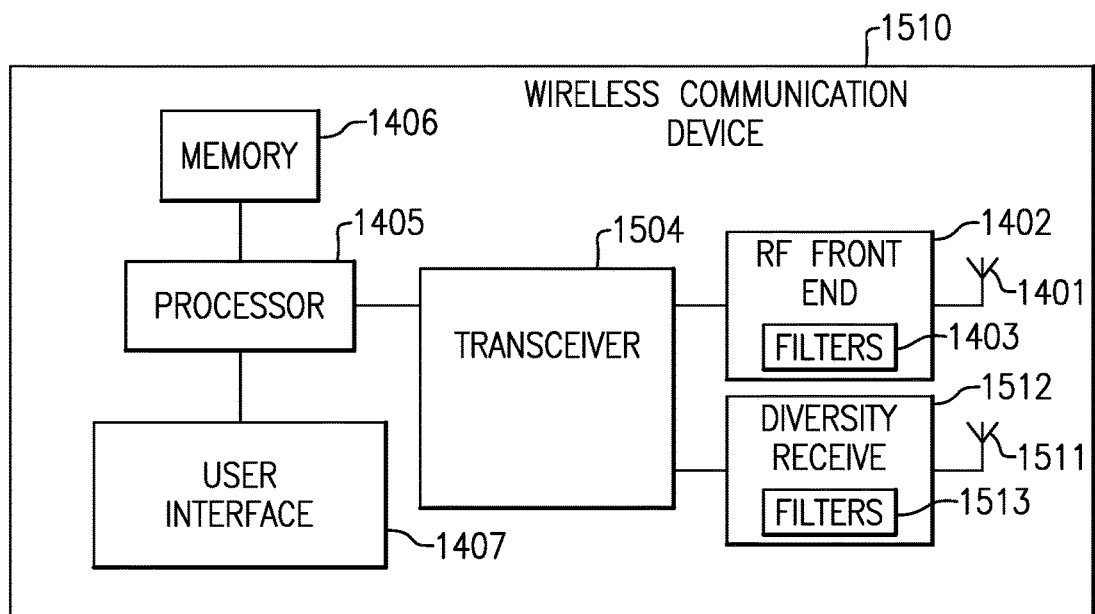
FIG. 10 is a schematic block diagram of another wireless communication device that includes a surface acoustic wave filter in accordance with one or more embodiments.

FIG. 10 is a schematic diagram of a wireless communication device 1510 that includes filters 1503 in a radio frequency front end 1502 and second filters 1513 in a diversity receive module 1512. The wireless communication device 1510 is like the wireless communication device 1500 of FIG. 9, except that the wireless communication device 1520 also includes diversity receive features. As illustrated in FIG. 10, the wireless communication device 1520 includes a diversity antenna 1511, a diversity module 1512 configured to process signals received by the diversity antenna 1511 and including filters 1513, and a transceiver 1504 in communication with both the radio frequency front end 1502 and the diversity receive module 1512. The filters 1513 may be packaged with one another, or with a subset of the filters 1513, and can include packaged SAW devices including any suitable combination of features discussed with reference to any embodiments discussed herein.

Any suitable principles and advantages of the surface acoustic wave devices disclosed herein can be implemented with one or more temperature compensated SAW resonators. Temperature compensated SAW resonators include a temperature compensation layer (e.g., a silicon dioxide layer) over an interdigital transducer electrode to bring a temperature coefficient of frequency closer to zero.

Packaged surface acoustic wave devices disclosed herein can include one or more surface acoustic wave resonators included in a filter arranged to filter a radio frequency signal in a fourth generation (4G) Long Term Evolution (LTE) operating band. Packaged surface acoustic wave devices disclosed herein can include one or more surface acoustic wave resonators included in a filter arranged to filter a radio frequency signal in a fifth generation (5G) New Radio (NR) operating band within Frequency Range 1 (FR1). FR1 can be from 410 megahertz (MHz) to 7.125 gigahertz (GHz), for example, as specified in a current 5G NR specification. Packaged surface acoustic wave devices disclosed herein can include one or more surface acoustic wave resonators included in a filter with a passband corresponding to both a 4G LTE operating band and a 5G NR operating band within FR1.

Any of the embodiments described above can be implemented in association with a radio frequency system and/or mobile devices such as cellular handsets. The principles and advantages of the embodiments can be used for any systems or apparatus that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, a peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged surface acoustic wave device comprising:
   a support substrate having a first side and a second side opposite the first side, the support substrate including a conductive via extending vertically between the first side to the second side;
   a piezoelectric layer over the first side of the support substrate;
   an interdigital transducer electrode over the piezoelectric layer;
   a roof structure over the interdigital transducer electrode; and
   a conductive pillar disposed between the first side of the support substrate and the roof structure, the conductive pillar supporting the roof structure, a maximum horizontal dimension of the conductive pillar being greater than a maximum horizontal dimension of the conductive via.

2. The packaged surface acoustic wave device of claim 1 wherein the conductive pillar defines at least a portion of an electrical pathway between the interdigital transducer electrode and the conductive via.

3. The packaged surface acoustic wave device of claim 1 wherein the maximum horizontal dimension of the conductive pillar is at least three times greater than the maximum horizontal dimension of the conductive via.

4. The packaged surface acoustic wave device of claim 1 wherein the roof structure is configured such that there is no signal communication between the conductive pillar and the roof structure, and the roof structure does not include any electronic component mounted thereon.

5. The packaged surface acoustic wave device of claim 1 wherein the roof structure and the support substrate includes the same material.

6. The packaged surface acoustic wave device of claim 1 wherein the roof structure includes resin.

7. The packaged surface acoustic wave device of claim 1 further comprising a dielectric layer disposed between the support substrate and the piezoelectric layer.

8. The packaged surface acoustic wave device of claim 1 further comprising a conductive structure disposed between and connecting the interdigital transducer electrode and the conductive pillar.

9. The packaged surface acoustic wave device of claim 8 further comprising a second interdigital transducer electrode over the piezoelectric layer.

10. The packaged surface acoustic wave device of claim 9 further comprising a second conductive structure electrically connecting the interdigital transducer electrode and the second interdigital transducer electrode.

11. The packaged surface acoustic wave device of claim 10 further comprising a second conductive pillar disposed between the second conductive structure and the roof structure, the second conductive pillar configured to dissipate heat generated by the interdigital transducer electrode.

12. The packaged surface acoustic wave device of claim 11 further comprising a third conductive pillar supporting the roof structure relative to the support substrate and a third conductive structure electrically connecting the second interdigital transducer electrode and the third conductive pillar, wherein the support substrate includes a second conductive via formed therein, the third conductive pillar defining at least a portion of an electrical pathway between the second interdigital transducer electrode and the second conductive via.

13. The packaged surface acoustic wave device of claim 1 wherein the interdigital transducer electrode is positioned in a cavity defined between the support substrate and the roof structure, the cavity is sealed by a cavity seal disposed laterally around the interdigital transducer electrode.

14. The packaged surface acoustic wave device of claim 13 wherein the conductive pillar and the cavity seal includes the same material.

15. The packaged surface acoustic wave device of claim 1 wherein the piezoelectric layer is partially disposed over the support substrate.

16. The packaged surface acoustic wave device of claim 1 wherein the conductive via extends vertically through the support substrate, and a maximum horizontal dimension of the conductive pillar being greater than a maximum horizontal dimension of the conductive via.

17. The packaged surface acoustic wave device of claim 1 wherein the conductive pillar is positioned directly over the conductive via.

18. A packaged surface acoustic wave device comprising:
   a multilayer piezoelectric substrate having a first side and a second side opposite the first side, the support substrate including a conductive a via extending vertically between the first side to the second side, the multilayer piezoelectric substrate including a support substrate and a piezoelectric layer over the support substrate;
   an interdigital transducer electrode over the piezoelectric layer;
   a roof structure over the interdigital transducer electrode; and
   a conductive support structure disposed between the multilayer piezoelectric substrate and the roof structure, the conductive support structure supporting the roof structure, a maximum horizontal dimension of the conductive pillar being greater than a maximum horizontal dimension of the conductive via.

19. The packaged surface acoustic wave device of claim 18 wherein the conductive support structure defines at least a portion of an electrical pathway between the interdigital transducer electrode and the conductive via.

20. The packaged surface acoustic wave device of claim 18 wherein the interdigital transducer electrode is positioned in a cavity defined between the support substrate and the roof structure, the cavity is sealed by a cavity seal disposed laterally around the interdigital transducer electrode.

* * * * *